United States Patent
Baldwin et al.

(10) Patent No.: US 6,587,896 B1
(45) Date of Patent: *Jul. 1, 2003

(54) IMPEDANCE MATCHING DEVICE FOR HIGH SPEED MEMORY BUS

(75) Inventors: Donald Baldwin, Boise, ID (US); Brett L. Williams, Eagle, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/031,984

(22) Filed: Feb. 27, 1998

(51) Int. Cl.[7] ............................. G06F 3/00; H03K 17/16; H03K 19/003
(52) U.S. Cl. ............................................ 710/13; 326/30
(58) Field of Search ........................ 709/105; 710/129, 710/101, 126, 13; 326/30, 82, 21, 83; 333/12, 17.3, 124, 247, 260, 254, 253, 33; 365/222; 357/45

(56) References Cited

U.S. PATENT DOCUMENTS

| | | | | |
|---|---|---|---|---|
| 4,500,974 A | * | 2/1985 | Nagami | 365/222 |
| 4,575,744 A | * | 3/1986 | Caldwell et al. | 357/45 |
| 5,162,894 A | * | 11/1992 | Asano et al. | 257/691 |
| 5,264,729 A | * | 11/1993 | Rostoker et al. | 257/774 |
| 5,266,912 A | | 11/1993 | Kledzik | 333/247 |
| 5,301,343 A | * | 4/1994 | Alvarez | 711/170 |
| 5,400,003 A | | 3/1995 | Kledzik | 333/247 |
| 5,514,982 A | * | 5/1996 | Hall et al. | 326/83 |
| 5,612,657 A | * | 3/1997 | Kledzik | 333/247 |
| 5,638,322 A | * | 6/1997 | Lacey | 365/185.2 |
| 5,663,661 A | * | 9/1997 | Dillon et al. | 326/30 |
| 5,710,693 A | * | 1/1998 | Tsukada et al. | 361/686 |
| 5,729,152 A | * | 3/1998 | Leung et al. | 326/21 |
| 5,809,531 A | * | 9/1998 | Brabandt | 711/141 |
| 5,864,463 A | * | 1/1999 | Tsukada et al. | 361/686 |
| 5,878,241 A | * | 3/1999 | Wilkinson et al. | 712/203 |

* cited by examiner

Primary Examiner—Frantz B. Jean
(74) Attorney, Agent, or Firm—Schwegman, Lundberg, Woessner & Kluth, P.A.

(57) ABSTRACT

A memory bus impedance matching module is inserted in each empty memory expansion socket on a computer memory bus to provide a constant impedance on the bus. Impedance devices, such as non-functional memory devices, are mounted on the module housing and coupled to standard bus communication line connections on the module housing. The modules are placed on the memory bus to prevent communication errors without needing to fill each expansion socket with real memory.

38 Claims, 5 Drawing Sheets

IMPEDANCE MATCHING DEVICE FOR HIGH SPEED MEMORY BUS

TECHNICAL FIELD OF THE INVENTION

The present invention relates generally to personal computers and in particular to memory buses in personal computers.

BACKGROUND OF THE INVENTION

Personal computers, as shown in FIGS. 1A and 1B, include a monitor 100, keyboard input 102 and a central processing unit 104. The processor unit typically includes a microprocessor 106, a memory bus circuit 108, and other peripheral circuitry 110. The memory bus is provided with a number of expansion sockets to allow the purchaser of the personal computer to install additional memory circuits as the user's needs change. A number of expansion sockets for memory upgrades typically exist along a memory bus. The expansion sockets remain empty unless the user decides to upgrade the system's memory by installing additional memory circuits. However, users frequently do not fill the expansion sockets, resulting in a memory bus that is operating under a less than maximum load.

In general, the characteristic impedance of the computer's memory bus interface is designed to match the impedance of a fully loaded memory bus. Thus, when the memory bus is fully loaded, the interface and the bus are matched. However, when the memory bus is minimally loaded, the mismatch in impedance creates a ringing effect on the bus which results in overshoot and undershoot in a signal communicated over the bus. The ringing is a result of signal "ghosts" which reflect or bounce along the communication line. As memory bus communication speeds increase, the ringing effect is more likely to result in communication errors. Although termination devices can be installed on the bus to alleviate some of the ringing, the current designs require the end user to properly relocate the termination device on the bus when installing additional memory. Installing the termination device in the wrong socket can worsen the ringing effect.

Another approach to solving the problem of mismatched impedances is to design a high-speed memory bus optimized for both minimum and maximum loading conditions. Such a design task increases in difficulty as the speed of the bus increases. Obviously, bus design can be simplified if the difference between the minimum and maximum loading conditions is small.

For the reasons stated above, and for other reasons stated below which will become apparent to those skilled in the art upon reading and understanding the present specification, there is a need in the art for a computer which combines expandable memory with a high speed communication bus without incurring data errors due to impedance mismatch when the computer operates with less than the full compliment of memory.

SUMMARY OF THE INVENTION

The above mentioned problems with communicating with high speed memories and other problems are addressed by the present invention and which will be understood by reading and studying the following specification.

In particular, the present invention is a memory bus impedance matching module with a module housing adapted to fit into a memory socket of a memory bus. The module housing has locations for N number of impedance devices and includes communication line connections. N impedance devices are mounted on the housing and coupled to the communication line connections. Each memory bus impedance matching module exhibits an impedance substantially equal to that of a functional memory module adapted to fit into the memory expansion socket. The module housing can be manufactured to fit into a socket designed to receive a JEDEC standard circuit package, such as a single or dual in-line memory module. The impedance devices are defective packaged direct random access memory (DRAM), DRAM dies, or other devices exhibiting an impedance substantially similar to a functional memory device. The memory bus impedance matching module can be powered to more closely match the impedance of a functional memory module.

In another aspect of the invention, a memory bus comprises a functional memory module and a memory bus impedance matching module. The memory bus impedance matching module is populated only with impedance devices and exhibits substantially the same impedance as the functional memory modules. The memory bus impedance matching module also comprises communication line connections suitable for coupling to the memory bus and which are coupled to the impedance devices.

In yet another aspect of the invention, a method is described that reduces errors in a memory bus connected to a microprocessor when at least one expansion socket on the memory bus is empty and one functional memory module is coupled to the bus. The method comprises the step of installing a memory bus impedance matching module in each empty socket on the memory bus. The memory bus impedance matching module is populated only with impedance devices and has an impedance substantially equal to that of the functional memory module. The method optionally includes the step of replacing a memory bus impedance matching module with a functional memory module.

A method of making the memory bus impedance matching module is also disclosed.

Because the memory bus impedance matching module exhibits the same load as a functional memory module, the impedance of the memory bus remains constant regardless of the amount of real memory installed in the computer system and communication errors are reduced. System architecture design is simplified as the designer need only be concerned with optimizing memory bus operations under fully loaded conditions. Further, upgrading of memory by the end-user is made easier than with the prior art termination devices since the end-user merely replaces a memory bus impedance matching module with a functional memory module without the inconvenience of relocating the termination device.

DETAILED DESCRIPTION OF THE PREFERRED EMBODIMENT

Figures 1A, 1B:
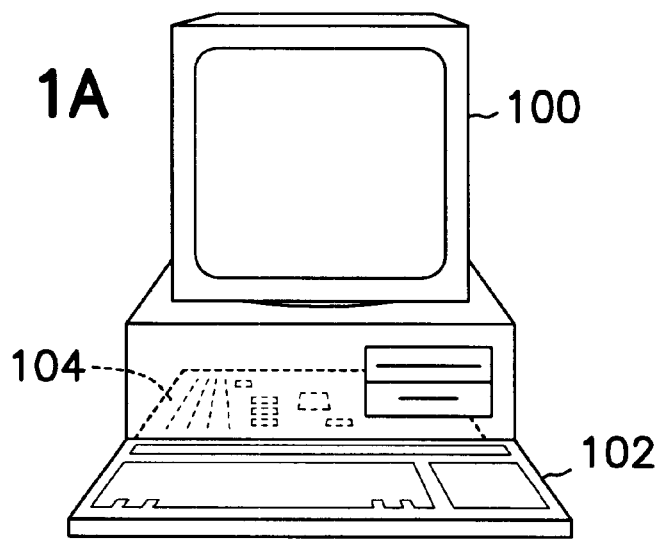
FIGS. 1A and 1B illustrate a personal computer.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

There are a number of types of integrated circuit memories commercially available. For example, dynamic memory circuits having memory cells arranged to be accessed in a random fashion are referred to as dynamic random access memories or DRAMs. These memories can be produced in a variety of designs which provide different methods of reading from and writing to the dynamic memory cells of the memory. One such method is page mode operation. Page mode operations in a DRAM are defined by the method of accessing a row of a memory cell array and randomly accessing different columns of the array. Data stored at the row and column intersection can be read and output while that column is accessed. Page mode DRAMs require access steps which limit the communication speed of the memory circuit. A typical communication speed using page mode DRAMs is approximately 33 MHZ.

An alternate type of memory circuit is the extended data output (EDO) memory which allows data stored at a memory array address to be available as output after the addressed column has been closed. This memory circuit can increase some communication speeds by allowing shorter access signals without reducing the time in which memory output data is available on the memory bus. A more detailed description of a DRAM having EDO features is provided in the "1996 DRAM Data Book", pages 2–1 to 2–15 available from Micron Technology, Inc. Boise, Id., the assignee of the present application and is incorporated herein by reference.

Yet another type of memory circuit is a burst access memory which receives one address of a memory array on external address lines and automatically addresses a sequence of columns without providing additional column addresses on the external address lines. Burst EDO memory circuits are capable of outputting data at significantly faster communication rate than previous memory circuits. Burst EDO memories can operate at speeds in excess of 66 MHZ, with potential frequencies of 200 MHZ.

Also available is a synchronous dynamic random access memory (SDRAM) which is designed to operate in a synchronous memory system. SDRAMs offer substantial advances in dynamic memory operating performance. For example, some SDRAMs are capable of synchronously providing burst data in a burst mode at a high-speed data rate by automatically generating a column address to address a memory array of storage cells organized in rows and columns for storing data within the SDRAM. In addition, if the SDRAM includes two banks of memory arrays, the SDRAM preferably permits interleaving between the two banks to hide precharging time. At the present time, for example, the standard high speed for known SDRAM devices is about 100 MHZ.

As described above, a personal computer includes a microprocessor and a memory bus. The computer is usually sold by the manufacture with empty memory expansion sockets, resulting in a partially full memory bus. This allows the purchaser of the computer to customize the computer to meet their personal needs by adding memory modules as necessary. Because of the difficulty of designing a high speed memory bus which handles both minimum and maximum memory loads, the memory bus interface is usually designed to have an impedance which matches a fully loaded memory bus. Therefore, if the memory bus is only partially full, the memory bus and its interface will have a mismatched impedance. Mismatched impedances along a high-speed communication line, as known to one skilled in the art, result in signal errors.

Figure 2A:
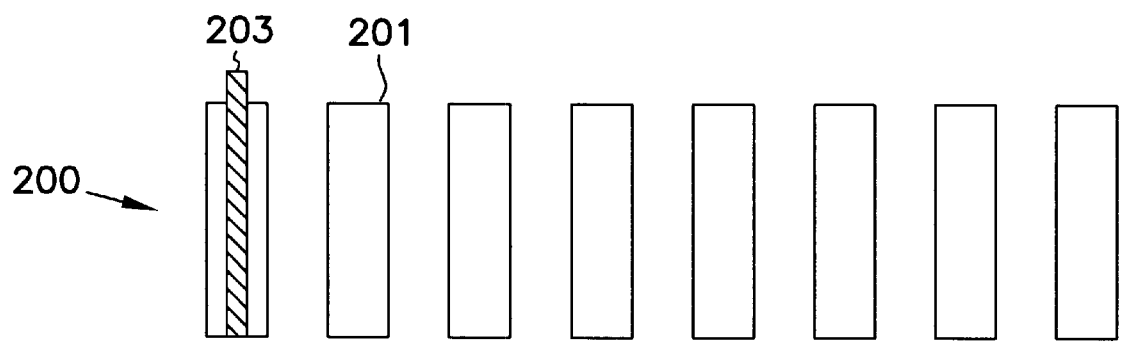
FIGS. 2A and 2B illustrate impedance loads on a memory bus of the computer of FIG. 1.
Figure 2B:
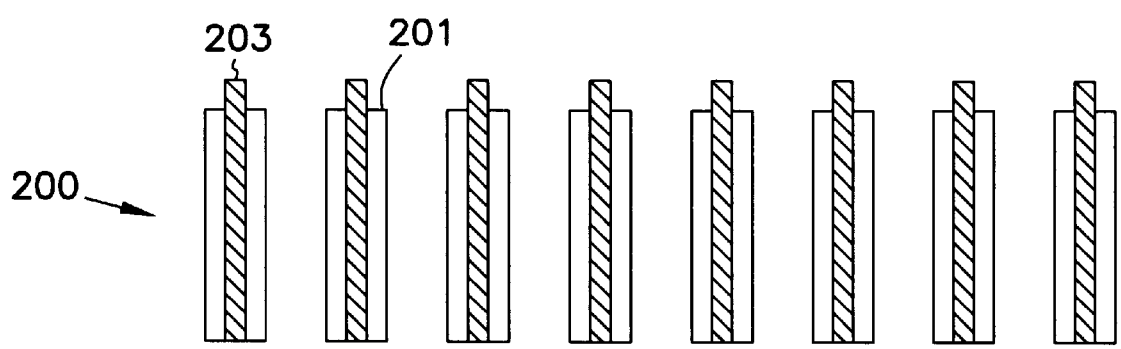

FIGS. 2A and 2B illustrate the difference in impedance loading in a computer system having eight memory expansion sockets 201 on its memory bus 200. FIG. 2A shows a single functional memory module 203 inserted in an expansion socket 201; the other seven sockets are empty. The functional memory module 203 exhibits an impedance of 8 picofarads (pf)/pin, hence the impedance of the memory bus 200 in FIG. 2A is 8 pf/pin. Contrast the impedance of the memory bus in FIG. 2A with the impedance of memory bus 200 in FIG. 2B which shows all eight expansion sockets 201 filled with functional memory modules identical to the module 203 shown in FIG. 2A. The memory bus impedance in FIG. 2B is 8×8 pf/pin for a total impedance of 64pf/pin. Thus, there is an eight-fold difference in the impedances of the memory bus 200 when minimally loaded as in FIG. 2A and fully loaded as in FIG. 2B.

The present invention alleviates the difference in impedances between a fully loaded and a partially loaded memory bus by placing a memory bus impedance matching module in each memory expansion socket which does not contain a functional memory module. The memory bus impedance matching modules exhibit substantially the same load as a functional memory module so that the system memory bus operates under a constant full load.

Figure 3A:
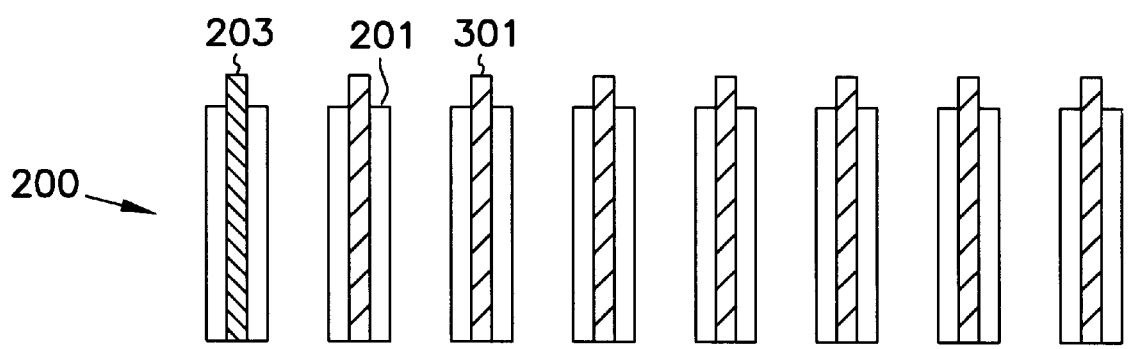
FIGS. 3A, 3B, and 3C illustrate impedance loads on the memory bus of FIG. 1 under the present invention.
Figure 3B:
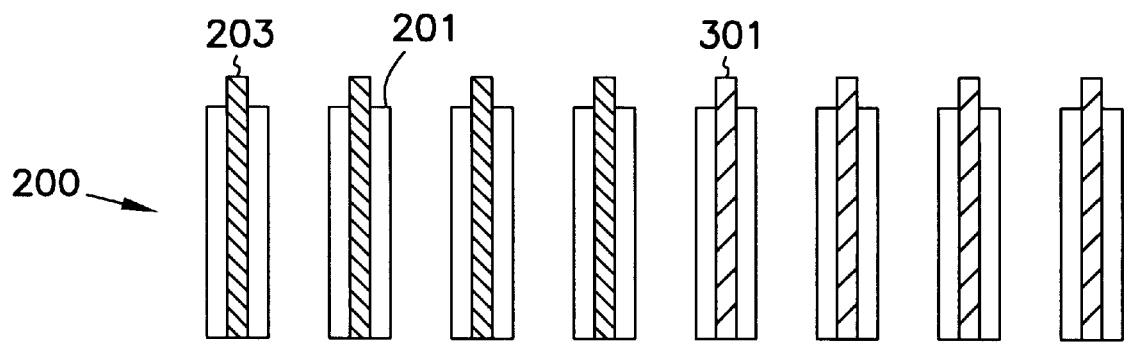
Figure 3C:
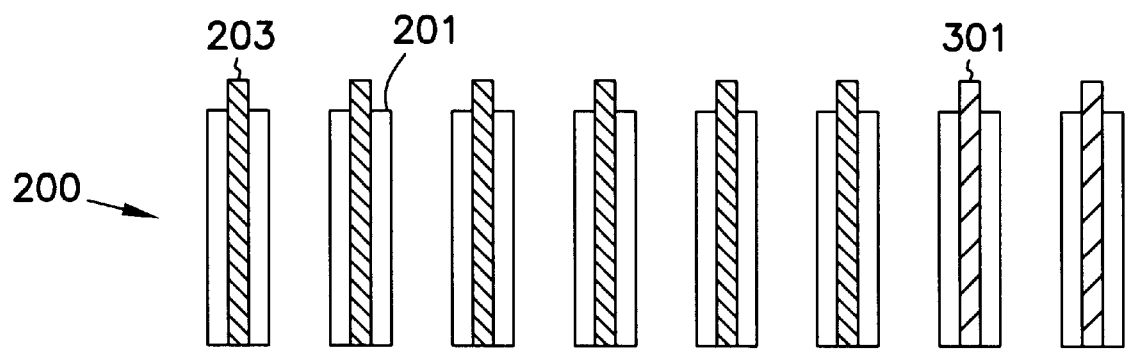

Thus using memory bus impedance matching modules 301, as shown in FIGS. 3A–3C, the impedance of the memory bus 200 is a constant 64 pf/pin regardless of the number of functional memory modules 203 inserted in the expansion sockets: one functional memory module 203 with seven non-functional modules 301 in FIG. 3A, four and four in FIG. 3B, and six and two in FIG. 3C. An additional advantage of the present invention is that the user does not have to be concerned with moving a termination device from one socket to another when inserting new memory modules. Instead, the user simply replaces any memory bus impedance matching module 301 with a functional one 203.

Figure 4:
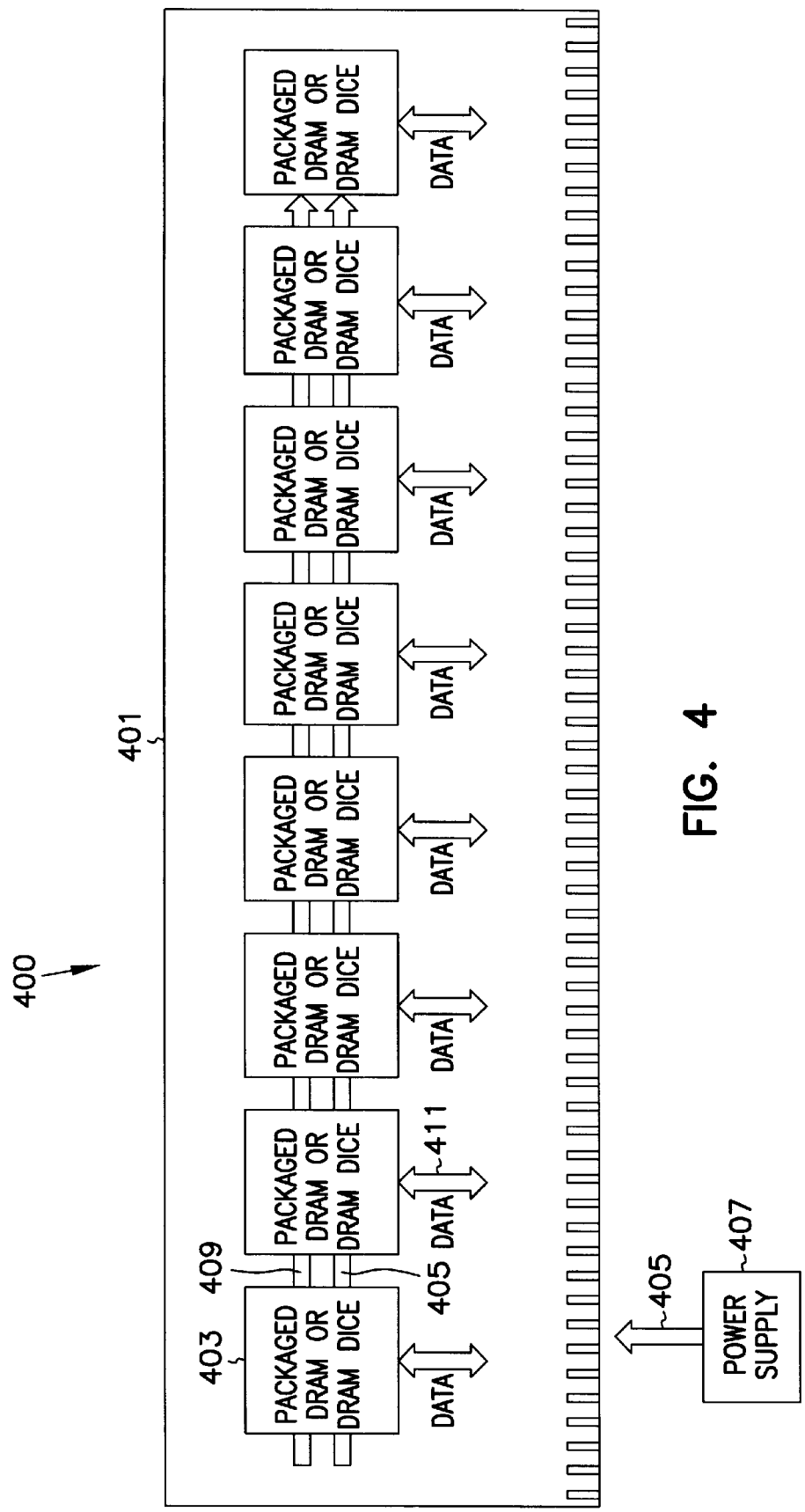
FIGS. 4 is a block diagram of one embodiment of a memory bus impedance matching module.
Figure 5:
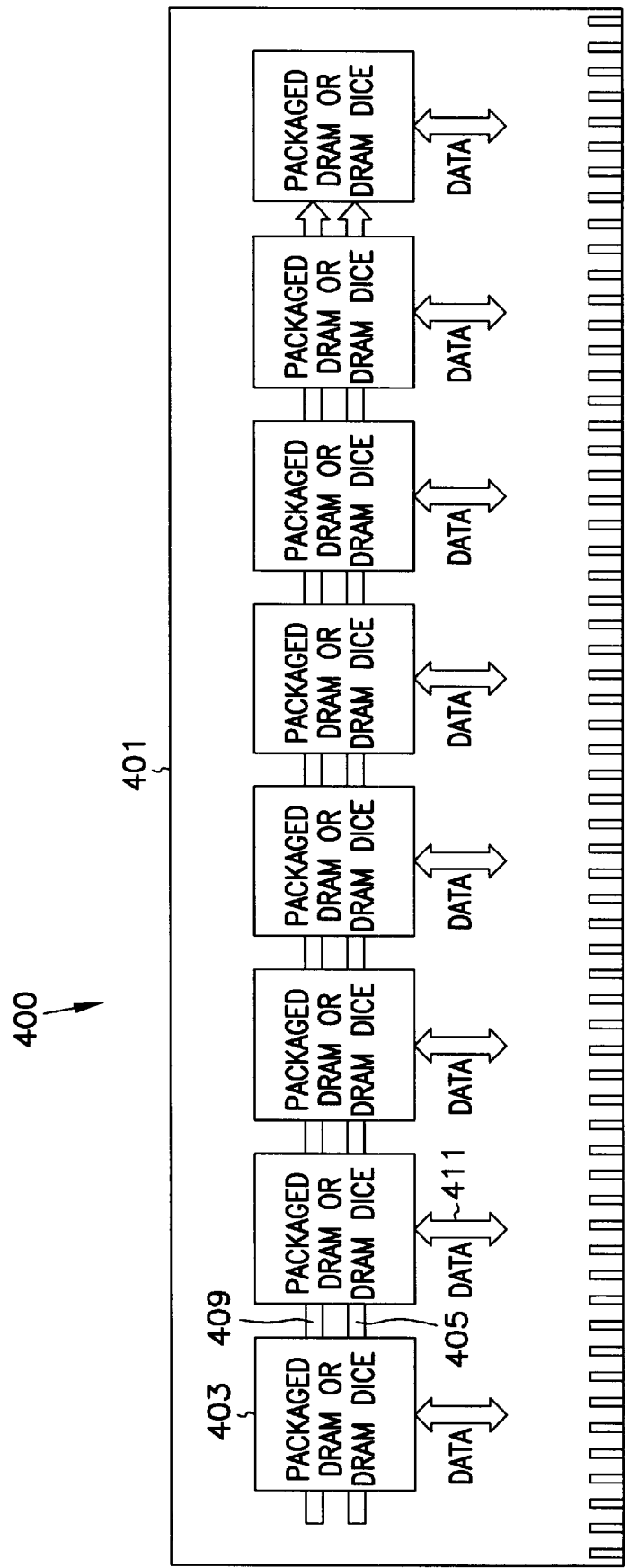
FIG. 5 is a block diagram of another embodiment of a memory bus impedance matching module.

FIGS. 4 and 5 are described in terms of a memory bus impedance matching module 400 intended to be placed in a memory expansion socket adapted to receive a standard single in-line memory module (SIMM), such as a 1 MB×32 bit DRAM SIMM, model MT8D132(X) available from Micron Technology, Inc. Boise, Id., the assignee of the present application, a dual in-line memory module (DIMM), such as a 1 MB×64 bit DRAM DIMM, model MT16D164 available from Micron Technology, or any industry standard memory module, such as one conforming to JEDEC standard memory module pinouts and mechanical dimensions. The memory bus impedance matching module housing 401 is illustrated as a SIMM board with a housing 401 that includes connections to standard bus communications lines such as data input/output, address lines, row address signal (RAS*), and column address signal (CAS*). The memory bus impedance matching module 400 is populated only with impedance devices 403 which are coupled to the communication lines connections on the housing 401. Because the impedance devices are not required to function when used with the module 400, defective memory devices, such as packaged DRAMs and DRAM dies (dice), are suitable impedance devices 403 as illustrated in FIGS. 4 and 5. However, it will be appreciated by those skilled in the art that any device exhibiting substantially the required impedance is suitable for use as impedance device 403. Furthermore, it will be readily apparent to those skilled in that art that the memory bus impedance matching module can be any configuration used in memory device and computer memory bus designs and is not limited to SIMMs, DIMMs and DRAMs.

The memory bus impedance matching modules 400 are installed by the computer manufacture when the computer is assembled. Alternatively, the memory bus impedance matching modules 400 can be installed by a purchaser of the computer when upgrading the system with additional memories, such as SDRAMs.

In one embodiment shown in FIG. 4, the memory bus impedance matching SIMM 400 is populated with non-functional packaged DRAMs 403 which would normally be scrapped. The DRAMs 403 of FIG. 4 contain operable power supply lines 405 coupled to power supply 407 so that the impedance of the non-functional DRAMs 403 most closely matches that of functional DRAMs. As also shown in FIG. 4, the memory bus impedance matching SIMM 400 can be populated with non-functional DRAM dice instead of non-functional packaged DRAMs. The DRAM dice are placed directly on the SIMM board 401 and then covered with an insulator covering to seal them against contaminants using any of the mechanisms well known in the art.

In an alternate embodiment shown in FIG. 5, the non-functional DRAMs or DRAM dice 403 on the memory bus impedance matching SIMM are not powered when inserted in a bus expansion socket. Either the power supply lines in the DRAMs/DRAM dice 403 are defective, or the DRAMs/DRAM dice have been manufactured with internal fuses which are programmed to disconnect the power supply lines when the DRAMs/DRAMS dice are used in a memory bus impedance matching module. In the latter case, the DRAMs/DRAM dice have operable power supply lines 504 but other functions of the DRAMs/DRAM dice, such as address lines 409 or data input/output lines 411, are defective.

CONCLUSION

A memory bus impedance matching module has been described which is inserted in all empty expansion sockets on computer memory expansion bus. Because the memory bus impedance matching module exhibits substantially the same load as a functional memory module, the impedance of the memory bus remains constant regardless of the amount of real memory installed in the computer system. Thus, use of the memory bus impedance matching module reduces communications errors prevalent when a high-speed memory bus is only partially filled with memory. Additionally, system architecture design is simplified as the designer need only be concerned with optimizing memory bus operations under fully loaded conditions. Furthermore, because the memory bus impedance matching module can be populated with non-functional memory devices, memory scrap is reduced and the manufacturer can recoup production costs through the sale of the memory bus impedance matching modules to the computer vendor or to the end purchaser of the computer. Finally, since the packaging of a memory bus impedance matching module is the same as that of a functional memory module, when the end-user upgrades the computer with more memory, the end-user merely replaces a memory bus impedance matching module with a functional memory module without the inconvenience of relocating a termination device.

What is claimed is:

1. A memory bus impedance matching module comprising:
   a module housing adapted to fit into a memory expansion socket of a computer memory bus, the module housing having locations for mounting N impedance devices and including communication line connections suitable for coupling to the computer memory bus; and
   N impedance devices comprising non-functional dynamic random access memory packages having a defective power supply line, the N impedance devices mounted on the module housing and coupled to the communication line connections, wherein the memory bus impedance matching module exhibits an impedance substantially equal to that of a functional memory module adapted to fit into the memory expansion socket.

2. The memory bus impedance matching module of claim 1 wherein the module housing fits into a socket designed to receive an industry standard circuit package.

3. The memory bus impedance matching module of claim 2 wherein the module housing conforms to JEDEC standards.

4. The memory bus impedance matching module of claim 1 wherein the memory bus impedance matching module is powered by the bus.

5. The memory bus impedance matching module of claim 1 wherein the module housing is designed as a single in-line memory module.

6. The memory bus impedance matching module of claim 1 wherein the module housing is designed as a dual in-line memory module.

7. A memory bus comprising:
   a functional memory module; and
   a memory bus impedance matching module populated only with non-functional dynamic random access memory packages having an operable power supply line and defective address lines, the memory bus impedance matching module exhibiting an impedance substantially equal to that of the functional memory module.

8. The memory bus of claim 7 wherein the memory bus impedance matching module further comprises communication line connections coupled to the impedance devices and suitable for coupling to the memory bus.

9. The memory bus of claim 7 wherein the memory bus impedance matching module housing is designed as a single in-line memory module.

10. The memory bus of claim 7 wherein the memory bus impedance matching module housing is designed as a dual in-line memory module.

11. The memory bus of claim 7 further comprises power circuitry and wherein the memory bus impedance matching module is powered by the bus.

12. A method of reducing errors in a memory bus connected to a microprocessor when at least one expansion socket on the memory bus is empty and at least one functional memory module is coupled to the bus, the method comprising:
   installing in each empty expansion socket on the memory bus a memory bus impedance matching module populated only with non-functional dynamic random access memory packages having an operable power supply line and internal fuses programmed to disconnect the power supply line, the memory bus impedance matching module having an impedance substantially equal to that of the functional memory module.

13. The method of claim 12 further comprising:
replacing a memory bus impedance matching module with a functional memory module.

14. The method of claim 12 wherein the memory bus impedance matching module further comprises:
a module housing adapted to fit into the memory expansion socket; and
communication line connections coupled to the impedance devices and suitable for coupling to the memory bus.

15. A method of making a memory bus impedance matching module comprising:
testing memory devices and identifying certain memory devices which are non-functional and exhibit an impedance substantially similar to that of a functional memory device, the non-functional memory devices having a defective power supply line; and
mounting only the non-functional memory devices on a module housing adapted to fit into a memory expansion socket of a computer memory bus.

16. The method of claim 15 wherein the non-functional memory devices comprise dynamic random access memory packages.

17. The method of claim 15 wherein the non-functional memory devices comprise dynamic random access memory dice.

18. The method of claim 15 further comprising:
covering the mounted non-functional memory devices with an insulator covering.

19. A memory bus impedance matching module comprising:
a module housing adapted to fit into a memory expansion socket of a computer memory bus, the module housing having locations for mounting N impedance devices and including communication line connections suitable for coupling to the computer memory bus; and
N impedance devices having memory circuitry having an operable power supply line and defective address lines, the N impedance devices mounted on the module housing and coupled to the communication line connections, wherein the memory bus impedance matching module exhibits an impedance substantially equal to that of a functional memory module adapted to fit into the memory expansion socket.

20. The memory bus impedance matching module of claim 19 wherein the impedance devices comprise dynamic random access memory packages.

21. The memory bus impedance matching module of claim 19 wherein the impedance devices comprise dynamic random access memory dice.

22. The memory bus impedance matching module of claim 19 wherein the impedance devices comprise synchronous dynamic random access memory packages.

23. A memory bus comprising:
a functional memory module; and
a non-functional memory module populated only with impedance devices having a defective power supply line and exhibiting an impedance substantially equal to that of the functional memory module.

24. The memory bus of claim 23 wherein the impedance devices comprise dynamic random access memory packages.

25. The memory bus of claim 23 wherein the impedance devices comprise dynamic random access memory dice.

26. The memory bus of claim 23 wherein the impedance devices comprise synchronous dynamic random access memory packages.

27. A memory bus impedance matching module comprising:
a module housing adapted to fit into a memory expansion socket of a computer memory bus, the module housing having locations for mounting N impedance devices and including communication line connections suitable for coupling to the memory bus; and
N impedance devices having an operable power supply line and defective data input/output lines, the N impedance devices exhibiting an impedance substantially equal to that of memory devices on a functional memory module adapted to fit into the memory expansion socket and the N impedance devices mounted on the housing and coupled to the communication line connections.

28. A memory bus comprising:
a functional memory module; and
a memory bus impedance matching module populated only with defective memory devices having an operable power supply line and defective data input/output lines, the memory bus impedance matching module exhibiting an impedance substantially equal to that of the functional memory module.

29. The memory bus of claim 28 wherein the defective impedance memory devices comprise dynamic random access memory packages.

30. The memory bus of claim 28 wherein the defective memry devices comprise dynamic random access memory dice.

31. The memory bus of claim 28 wherein the defective impedance memory devices comprise synchronous dynamic random access memory packages.

32. A method of reducing errors in a memory bus connected to a microprocessor when at least one expansion socket on the memory bus is empty and at least one functional memory module is coupled to the bus, the method comprising:
installing in each empty expansion socket on the memory bus a memory bus impedance matching module populated only with non-functional memory devices having defective power supply lines, the impedance matching module having an impedance substantially equal to that of the functional memory module.

33. A memory bus impedance matching module comprising:
a module housing adapted to fit into a memory expansion socket of a computer memory bus, the module housing having locations for mounting N impedance devices and including communication line connections suitable for coupling to the computer memory bus; and
N impedance devices comprising non-functional dynamic random access memory dice having a defective power supply line, the N impedance devices mounted on the module housing and coupled to the communication line connections, wherein the memory bus impedance matching module exhibits an impedance substantially equal to that of a functional memory module adapted to fit into the memory expansion socket.

34. The memory bus impedance matching module of claim 33 wherein the module housing fits into a socket designed to receive an industry standard circuit package.

35. The memory bus impedance matching module of claim 34 wherein the module housing conforms to JEDEC standards.

36. The memory bus impedance matching module of claim 33 wherein the memory bus impedance matching module is powered by the bus.

37. The memory bus impedance matching module of claim 33 wherein the module housing is designed as a single in-line memory module.

38. The memory bus impedance matching module of claim 33 wherein the module housing is designed as a dual in-line memory module.

* * * * *